United States Patent
Ransun

(10) Patent No.: US 8,823,563 B1
(45) Date of Patent: Sep. 2, 2014

(54) CALIBRATION CIRCUIT FOR AN ANALOG-TO-DIGITAL CONVERTER

(71) Applicant: PMC-Sierra US, Inc., Sunnyvale, CA (US)

(72) Inventor: Johannes G. Ransun, Wyommissing Hills, PA (US)

(73) Assignee: PMC-Sierra US, Inc., Sunnyvale, CA (US)

( * ) Notice: Subject to any disclaimer, the term of this patent is extended or adjusted under 35 U.S.C. 154(b) by 0 days.

(21) Appl. No.: 14/106,836

(22) Filed: Dec. 15, 2013

(51) Int. Cl.
*H03M 1/00* (2006.01)

(52) U.S. Cl.
USPC .......................... 341/120; 341/155

(58) Field of Classification Search
CPC .................................. H03M 1/12; H03M 1/00
USPC .................................. 341/120, 118, 155, 156
See application file for complete search history.

(56) References Cited

U.S. PATENT DOCUMENTS

| | | | |
|---|---|---|---|
| 6,970,120 B1* | 11/2005 | Bjornsen | 341/120 |
| 7,623,050 B2 | 11/2009 | Le et al. | |
| 8,350,738 B2 | 1/2013 | Sanduleanu et al. | |
| 2012/0268301 A1 | 10/2012 | Thachile | |

\* cited by examiner

*Primary Examiner* — Joseph Lauture
(74) *Attorney, Agent, or Firm* — Dennis R. Haszko

(57) ABSTRACT

The present disclosure relates to a calibration circuit for an analog-to-digital converter (ADC). The calibration circuit includes a digital-to-analog converter (DAC) configured to generate a calibration voltage from a digital input, and a DC feedback control circuit. The DC feedback control circuit includes an ADC driver configured to operate in both an ADC calibration mode and in an ADC operation mode such that dynamic parameters of the ADC driver are unchanged when the ADC driver is operating in the ADC calibration mode and when the ADC driver is operating in the ADC operation mode. The DC feedback control circuit is also configured to: receive the calibration voltage from the DAC; modify the calibration voltage by cancelling offsets in the calibration voltage; and provide the modified calibration voltage to the ADC.

13 Claims, 9 Drawing Sheets

CALIBRATION CIRCUIT FOR AN ANALOG-TO-DIGITAL CONVERTER

FIELD

The present disclosure generally relates to high speed data communications receivers. More particularly, the present disclosure relates to the calibration of analog-to-digital converters (ADCs) in high speed data communications receivers.

BACKGROUND

Modern high speed data communications receivers must be capable of processing input signals that are severely impaired due to the properties of the transmission channel, for example, input signals that are impaired by frequency-dependent loss in copper backplanes or dispersion in optical fibers. Digital signal processing enables a high speed data communications receiver to adapt to a particular channel that it is paired with, by sampling and quantizing input data received at the high speed data communications receiver utilizing an ADC.

High speed ADCs, such as CMOS flash ADCs, must be area and power-efficient. As a result, high speed ADCs typically exhibit large inherent voltage offsets that require initial calibration. A prior art method of calibrating a high speed ADC utilizes a digital-to-analog converter (DAC) to calibrate a high speed ADC.

FIG. 1 illustrates an example of a known arrangement for calibrating a high speed ADC 100 that is driven by an ADC driver 110. In the arrangement shown in FIG. 1, the ADC 100 is located in a serial data communications receiver and the ADC 100 is calibrated by a calibration circuit 120 that includes a DAC 130.

The ADC driver 110 has two modes of operation, an ADC calibration mode and an ADC operation mode. When the ADC driver 110 is operating in the ADC operation mode, the low output impedance of the ADC driver 110 inhibits the development of error currents. However, when the ADC driver 110 is operating in the ADC calibration mode, only a relatively high output resistance of the DAC 130 is present at the input the ADC 100, such that the ADC driver 110 is effectively not in operation in the ADC calibration mode.

To reduce the total voltage error, a DAC 130 with a lower unit resistance R may be used. However, there are practical limits to this approach because for a given accuracy, smaller value resistors require more chip area. Further, utilizing a DAC 130 with a lower unit resistance R leads to higher DAC supply currents and, consequently, high voltage drops across the power nets, thereby causing further errors. The industry trend is for gate lengths to shrink with new silicon fabrication processes, and for ADC resolutions to go up. On the one hand, calibration errors go up as ADC drivers and ADCs grow in size due to increases in ADC driver leakage current and ADC kick-back charge. On the other hand, error tolerance of the ADC goes down as the resolution of the ADC is increased.

Improvements in calibration circuits for ADCs are therefore desirable.

BRIEF DESCRIPTION OF THE DRAWINGS

Embodiments of the present disclosure will now be described, by way of example only, with reference to the attached Figures.

DETAILED DESCRIPTION

Figure 1:
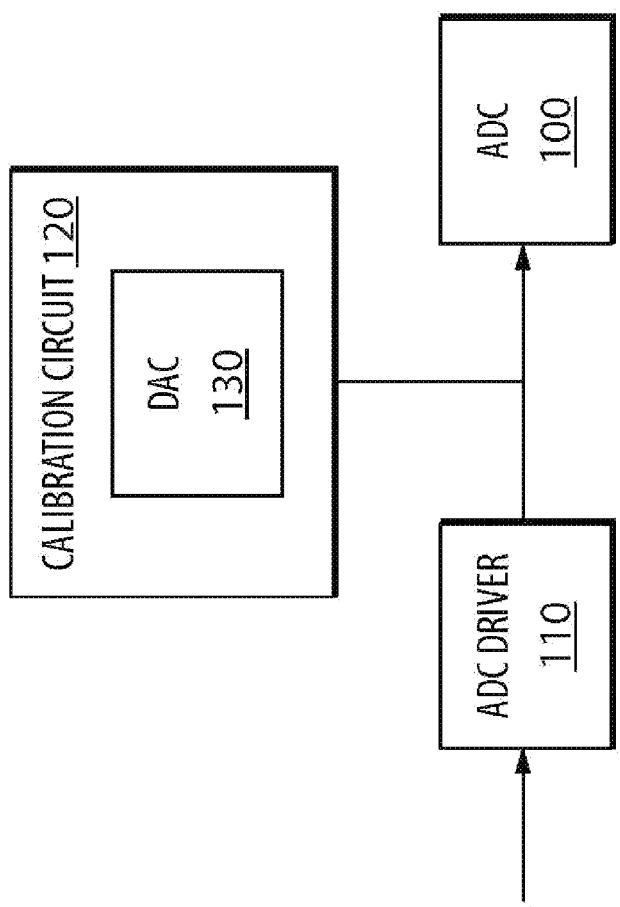
FIG. 1 is a block diagram of a prior art calibration circuit connected to an ADC in a serial data communications receiver.

According to one aspect, there is provided a calibration circuit for an ADC. The calibration circuit includes a DAC configured to generate a calibration voltage from a digital input, and a DC feedback control circuit. The DC feedback control circuit includes an ADC driver configured to operate in both an ADC calibration mode and in an ADC operation mode such that dynamic parameters of the ADC driver are unchanged when the ADC driver is operating in the ADC calibration mode and when the ADC driver is operating in the ADC operation mode. The DC feedback control circuit is also configured to: receive the calibration voltage from the DAC; modify the calibration voltage by suppressing offsets in the calibration voltage; and provide the modified calibration voltage to the ADC.

In another aspect, the DAC has an internal resistance and the DC feedback control circuit forms a transimpedance differential amplifier. The internal resistance of the DAC and the DC feedback control circuit together form an inverting unity gain differential amplifier. The DC feedback control circuit has a feedback loop impedance, the feedback loop impedance being equal to the internal resistance of the DAC to match the internal resistance of the DAC to the transimpedance of the transimpedance differential amplifier.

In another aspect, an input of the operational amplifier may be coupled to an output of the DAC to receive the generated calibration voltage, an output of the operational amplifier may be coupled to an input of the ADC driver, and an output of the ADC driver may be coupled to the input of the operational amplifier and an output of the calibration circuit to provide the modified calibration voltage to the ADC.

In another aspect, the transimpedance differential amplifier formed by the DC feedback control circuit may have a non-unity gain. In another aspect, the transimpedance differential amplifier formed by the DC feedback control circuit may have a unity gain.

In another aspect, the calibration circuit may also include a differential input for receiving an ADC input signal, and a first pair of switches coupled to the differential input of the calibration circuit and an input of the ADC driver. The first pair of switches may be configured to connect the differential input to the input of the ADC driver when the ADC driver is operating in the calibration mode and to disconnect the differential input from the input of the ADC driver when the ADC driver is operating in the ADC operation mode.

In another aspect, the calibration circuit may also include a second pair of switches coupled to the input of the ADC driver and to a ground via a pair of resistors. The second pair of switches may be configured to connect the input of the ADC driver to the ground via the pair of resistors so that a source impedance and dynamic properties of the ADC driver are unchanged when the ADC driver is operating in the ADC calibration mode and when the ADC driver is operating in the ADC operation mode.

In another aspect, the calibration circuit may also include an RC equalizer coupled to the differential input for DC coupling a differential voltage of a signal received on the differential input. In another aspect, the operational amplifier may be an integrating operational amplifier.

In another aspect, the calibration circuit may also include a third pair of switches coupled to the output of the DAC and to the input of the operational amplifier. The third pair of switches may be configured to connect the output of the DAC to the input of the operational amplifier when the ADC driver is operating in the ADC calibration mode and to disconnect the output of the DAC from the input of the operational amplifier when the ADC driver is operating in the ADC operation mode to increase the loop gain of the feedback control circuit.

In another aspect, the DC feedback control circuit of the calibration circuit may be configured to suppress static errors generated by the ADC driver.

In another aspect, the static errors may include a voltage offset generated by the ADC driver. In another aspect, the static errors may include a leakage current generated by the ADC driver.

In another aspect, there is provided a method for calibrating and operating an analog-to-digital converter (ADC). The method includes generating, at a digital-to-analog converter (DAC), a calibration voltage from a digital input and providing a DC feedback control circuit comprising an ADC driver and an operational amplifier. The method also includes operating the ADC driver in an ADC calibration mode to modify the calibration voltage by suppressing offsets in the calibration voltage and to provide the modified calibration voltage to the ADC. The ADC driver has dynamic parameters in the ADC calibration mode and the dynamic parameters have a first set of values. The method also includes operating the ADC driver in an ADC operation mode. The ADC driver maintains the first set of values of the dynamic parameters in the ADC operation mode.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described.

The present disclosure generally relates to a calibration circuit for an ADC in a serial data communications receiver that uses the ADC to sample and quantize received data for further processing in the digital domain.

Driving a high-resolution ADC in a serial data communications receiver requires an ADC driver circuit with a low static and dynamic impedance to inhibit leakage currents and ADC charge kick-back due to the sampling process from generating error voltages that add to the ADC input voltage. However, in prior art methods of calibrating an ADC, such as described in relation to FIG. 1, when the ADC driver is operating in an ADC calibration mode, the ADC driver is taken off-line by tri-stating the differential output of the ADC driver, and a DAC is put in its place that has a relatively high output resistance and lacks immunity to error currents. The tri-stated ADC driver differential output tends to be the worst offender: the ADC driver's high-speed drive capability is achieved by using large short-channel devices that are particularly susceptible to leakage currents.

In the calibration circuit of embodiments of the present disclosure, the ADC driver circuit is never taken off-line, and the ADC driver and DAC are both included or embedded in a composite circuit that drives the ADC. Thus, the ADC driver dynamics are the same when the ADC driver is operating in an ADC calibration mode and operating in an ADC operating mode.

Figure 2:
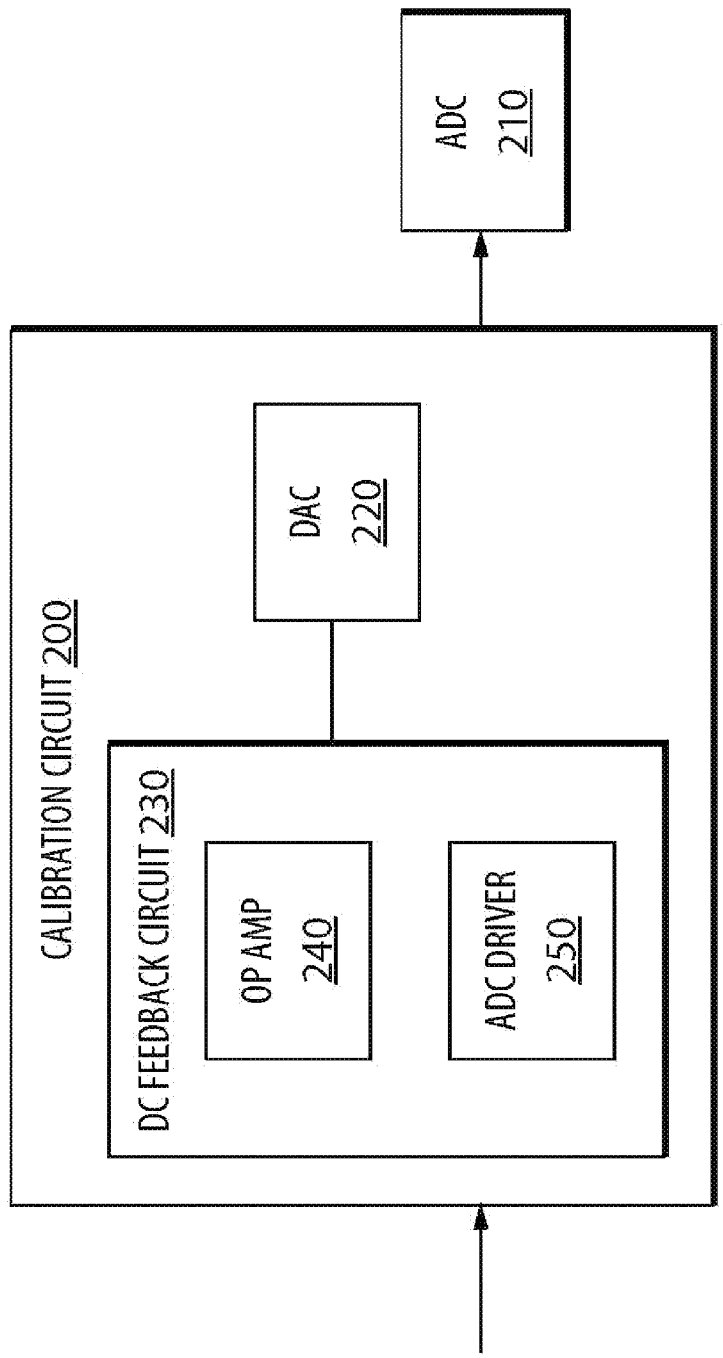
FIG. 2 is a block diagram of a calibration circuit connected to an ADC in a serial data communications receiver in accordance with an embodiment of the present disclosure.

FIG. 2 shows a block diagram of an embodiment of a calibration circuit 200 connected to an ADC 210 in a serial communications receiver in accordance with an embodiment of the present disclosure. The calibration circuit 200 includes a DAC 220 and a DC feedback circuit 230. The DAC 220 receives a digital code from a controller (not shown) of the serial communication system, generates a calibration voltage based on the received digital code, and provides the calibration voltage to DC feedback circuit 230. The DC feedback circuit 230 receives the calibration voltage from the DAC 220, receives an input voltage from a signal received at an input of the serial communications receiver, and generates a modified calibration voltage based on the received calibration voltage and the received input voltage.

The modified calibration voltage generated by the DC feedback circuit 230 is provided by the calibration circuit 200 to the ADC 210. In the embodiment shown in FIG. 2, the DC feedback circuit 230 includes an op-amp 240 and an ADC driver 250, which together form a differential transimpedance amplifier. The ADC driver 250 of the DC feedback circuit 230 operates in both an ADC calibration mode and an ADC operation mode such that dynamic parameters of the ADC driver 250 are unchanged when the ADC driver 250 is operating in the ADC calibration mode and when the ADC driver 250 is operating in the ADC operation mode. Dynamic parameters may include, for example, power supply rejection ratio, common mode rejection ratio, and output impedance as a function of frequency.

While the descriptions of FIG. 1 and FIG. 2 have been from the perspective of high level block diagrams, further aspects will be apparent in the context of discussions of circuit level diagrams. Features of embodiments of the present disclosure will be described in relation to circuit diagrams in FIGS. 4-9, after a description of FIG. 3, which is a prior art circuit diagram corresponding to the block diagram of FIG. 1.

Figure 3:
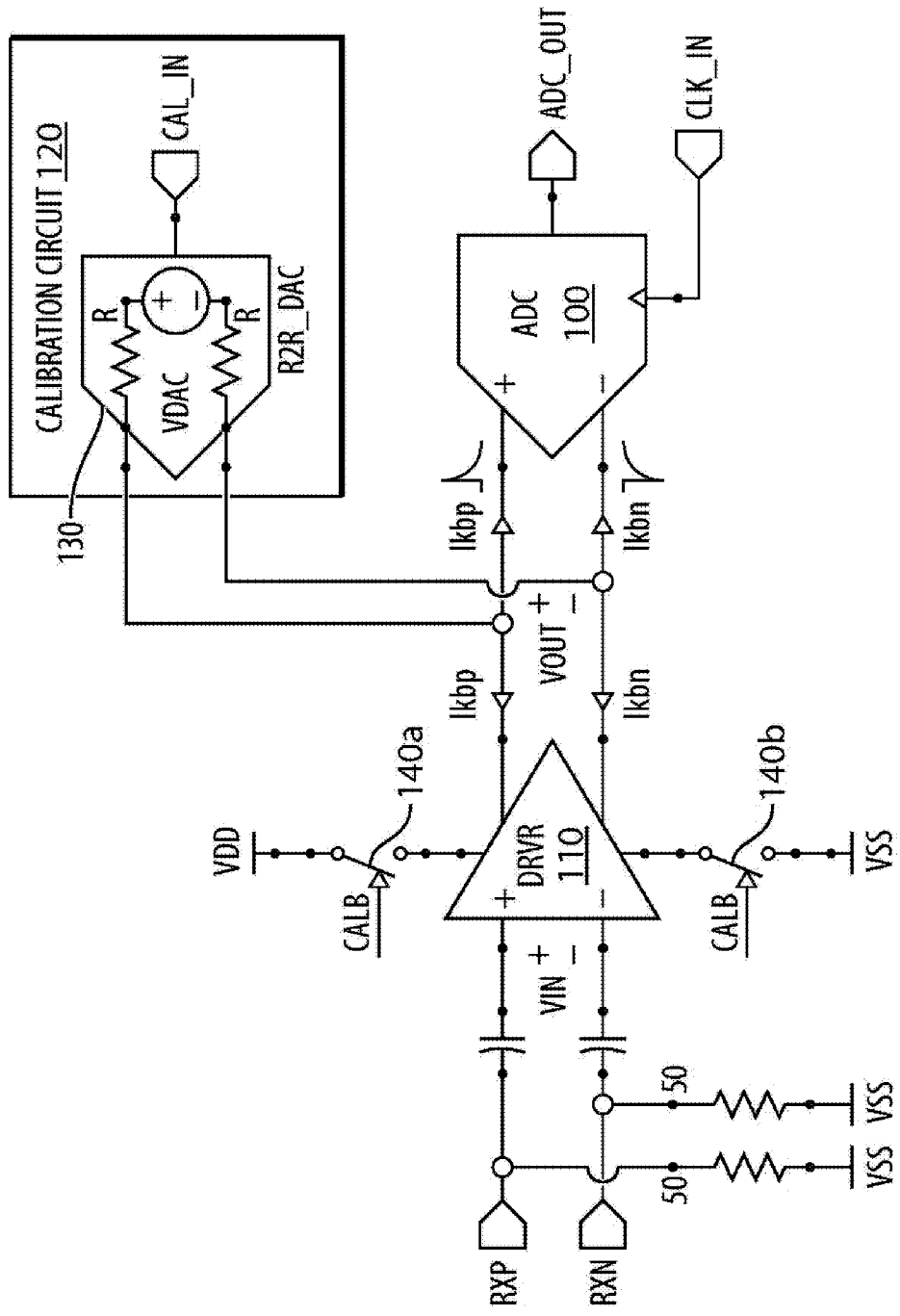
FIG. 3 is a circuit diagram corresponding to the block diagram shown in FIG. 1.

Referring to FIG. 3, the ADC driver 110 acts as an interface between the positive and negative input pads RXP, RXN of the serial data communications receiver and the differential input, VIN, of the ADC 100, and provides input termination, ESD protection, AC coupling, gain control, and a low-impedance drive to the ADC 100. When the ADC 110 driver is operating in the ADC calibration mode, the switches 140a, 140b are open, the ADC driver 110 is tri-stated, and the differential output, VOUT, of the DAC 130 is applied to the differential input of the ADC 100. When the ADC driver 110 is operating in the ADC operation mode, the switches 140a, 140b are closed, and the ADC driver 110 is turned on. The DAC 220 may remain connected in the ADC operation mode, as the output resistance of the DAC 220 is relatively high and does not impact the drive voltage VOUT in this mode. Because the DAC 130 is static and is not required to be particularly power-efficient, as it is only briefly operates in the ADC calibration mode, the DAC 130 may be designed for much higher linearity than an ADC 100.

The DAC 130 shown in FIG. 3 includes an R/2R resistor ladder, which presents a constant output resistance R and allows a rail-to-rail voltage range to each input of the ADC 100.

When the ADC driver 110 is operating in the ADC operation mode, the low output impedance of the ADC driver 110 inhibits the development of error currents. However, when the ADC driver 110 is operating in the ADC calibration mode, only a relatively high output resistance of the DAC 104 is present at the input the ADC 100. Any error currents, including leakage current from the ADC driver 110 and kick-back current from the ADC 100, are converted into error voltages, adding directly to the intended output voltage of the DAC 130 as follows:

$$VOUT = VDAC + R(llkp - llkn) + R(lkbp - lkbn) \quad (1)$$

in which VOUT is the voltage at the input of the ADC 100, VDAC is the voltage generated by the DAC 130, R is the internal resistance of the DAC 130, (llkp–llkn) is the leakage current from the ADC driver 110, and (lkpb–lkpb) is the kick-back charge injection current from the ADC 100.

Figure 4:
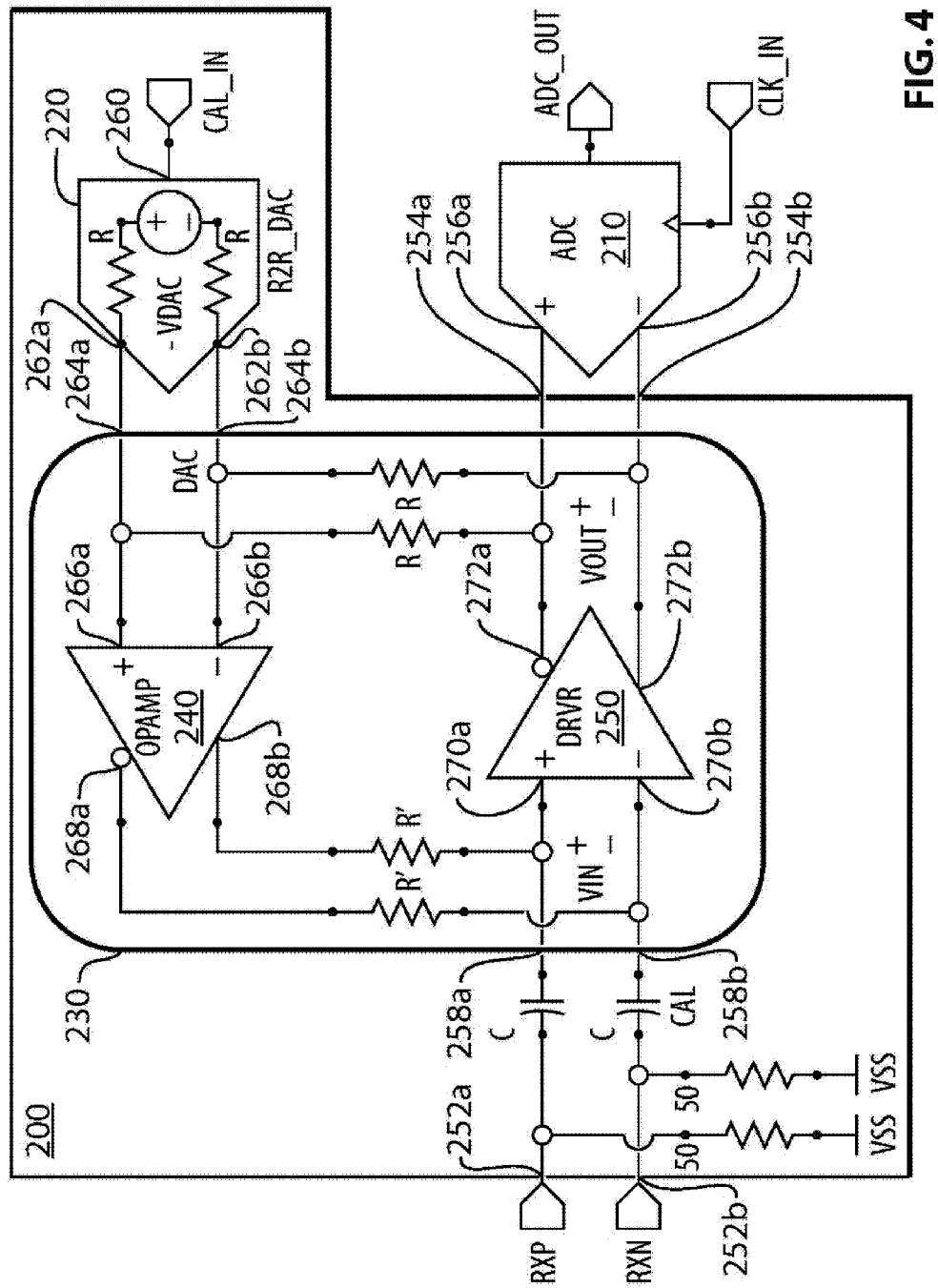
FIG. 4 is a circuit diagram corresponding to the block diagram shown in FIG.

FIG. 4 shows a circuit diagram corresponding to the block diagram in FIG. 2. The calibration circuit 200 includes a differential input 252a, 252b that is connected to positive and negative input pads RXP, RXN of serial communications receiver, a DAC 220, and a differential output 254a, 254b that provides a differential voltage, VOUT, to a differential input 256a, 256b of the ADC 210.

The differential input 252a, 252b of the calibration circuit 200 is connected to ground, VSS, through a pair of 50-Ω resistors and to a first differential input 258a, 258b of the DC feedback circuit 230 through a pair of capacitors, C.

The DAC 220 has an input 260 for receiving a digital code representing a calibration voltage, and a differential output 262a, 262b that is connected to a second differential input 264a, 264b of the DC feedback circuit 230 to provide a differential voltage, VDAC, to the DC feedback circuit 230. The DC feedback circuit 230 also has a differential output, which is the differential output 254a, 254b of the calibration circuit 200.

The operational amplifier 240 of the DC feedback circuit has a differential input 266a, 266b that is connected to the second differential input 264a, 264b of the DC feedback circuit 230, and a differential output 268a, 268b. The ADC driver 250 has a differential input 270a, 270b that is connected to the first differential input 258a, 258b of the DC feedback circuit 230 and to the differential output 268a, 268b of the operational amplifier 250 through a pair of resistors, R'. The ADC driver 250 also has a differential output 272a, 272b that is connected to the differential output of the DC feedback circuit 230, and to the differential input 266a, 266b of the operational amplifier 240 through a pair of resistors, R.

In the circuit shown in FIG. 4, in contrast to prior art calibration circuit shown in FIG. 3, the ADC driver 250 is part of a DC feedback control circuit 230 that is connected to the DAC 220. The DC feedback circuit 230 has two differential inputs, 258a, 258b and 264a, 264b, to receive two differential input voltages, VIN and VDAC, respectively, and one differential output that is connected to the differential output 254a, 254b of the calibration circuit 200. The differential output 254a, 254b of the calibration circuit 200 provides a differential voltage, VOUT, to the differential inputs 256a, 256b of the ADC 210. With respect to a high speed differential input signal received at the positive and negative input pads RXP, RXN the DC feedback control circuit 230 operates as a high-pass filter while rejecting DC voltage offsets in the ADC driver 250. With respect to the DAC 220, the DC feedback circuit 230 acts as a low-pass filter.

The DC feedback circuit 230 forms a transimpedence differential amplifier. The output resistance of the DAC 220 and the transimpedence differential amplifier, when combined, form an inverting unity gain differential amplifier when the feedback resistance of the transimpedence differential amplifier matches the output resistance of the DAC 220. In the embodiment shown in FIG. 4, the output resistance of the DAC 220 is 2R. The inverting unity gain differential amplifier senses a short-circuit current from the DAC 220. The inverting unity gain differential amplifier effectively buffers the open-circuit voltage of the DAC 220 and presents it to the ADC 210.

Figure 5:
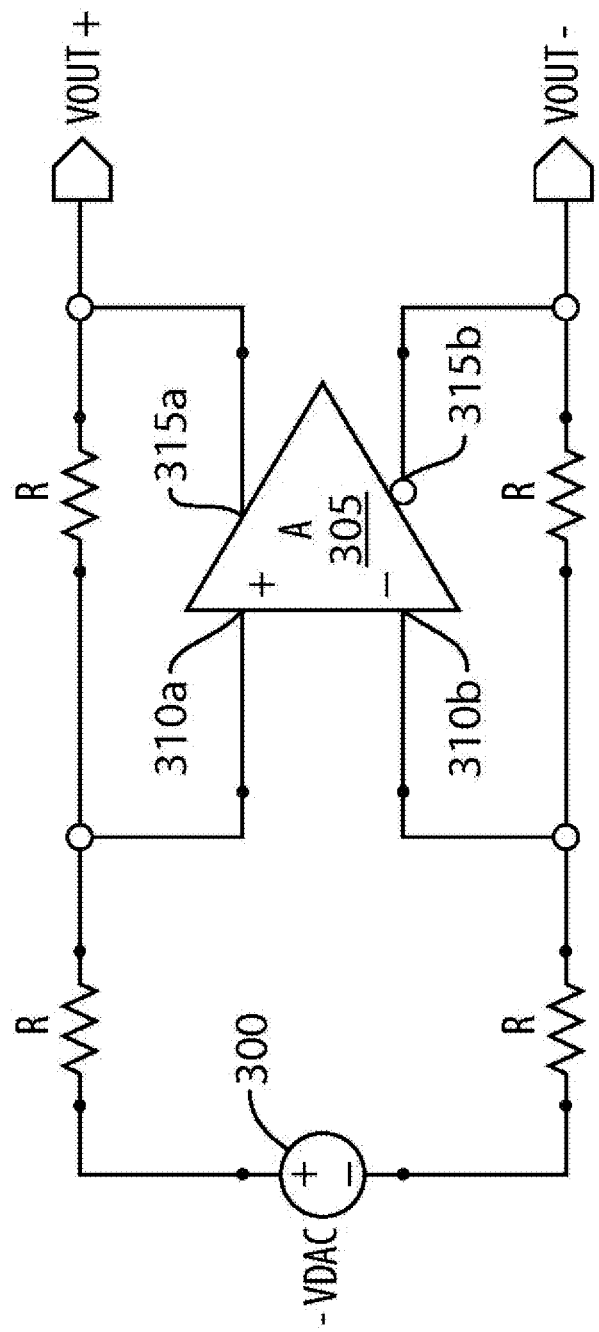
FIG. 5 is a circuit diagram of an alternative representation of the calibration circuit of FIG. 4.

FIG. 5 shows an alternative representation of the calibration circuit 200 of FIG. 4. The alternative representation includes a voltage source 300 that represents the differential calibration voltage, VDAC, generated by the DAC 220, and a transimpedence differential amplifier 305 formed by the DC feedback circuit 230. The differential voltage source 300 is connected to a differential input 310a, 310b of the transimpedance differential amplifier 305 through a pair of resistors, R. The transimpedance differential amplifier 305 generates a modified differential calibration voltage, VOUT, and outputs the generated modified differential calibration voltage on its differential output 315a, 315b.

By matching the transimpedance R to the internal resistance of the DAC 220 (FIG. 4), the open-circuit DC voltage of the DAC 220 (FIG. 4), VDAC, is buffered and the differential voltage, VOUT, is provided by the calibration circuit 200 at the differential output 410a, 410b of the calibration circuit 200. The differential voltage, VOUT, is calculated as follows:

$$VOUT = -VDAC \cdot \frac{-R}{R} = VDAC \quad (2)$$

Figure 6:
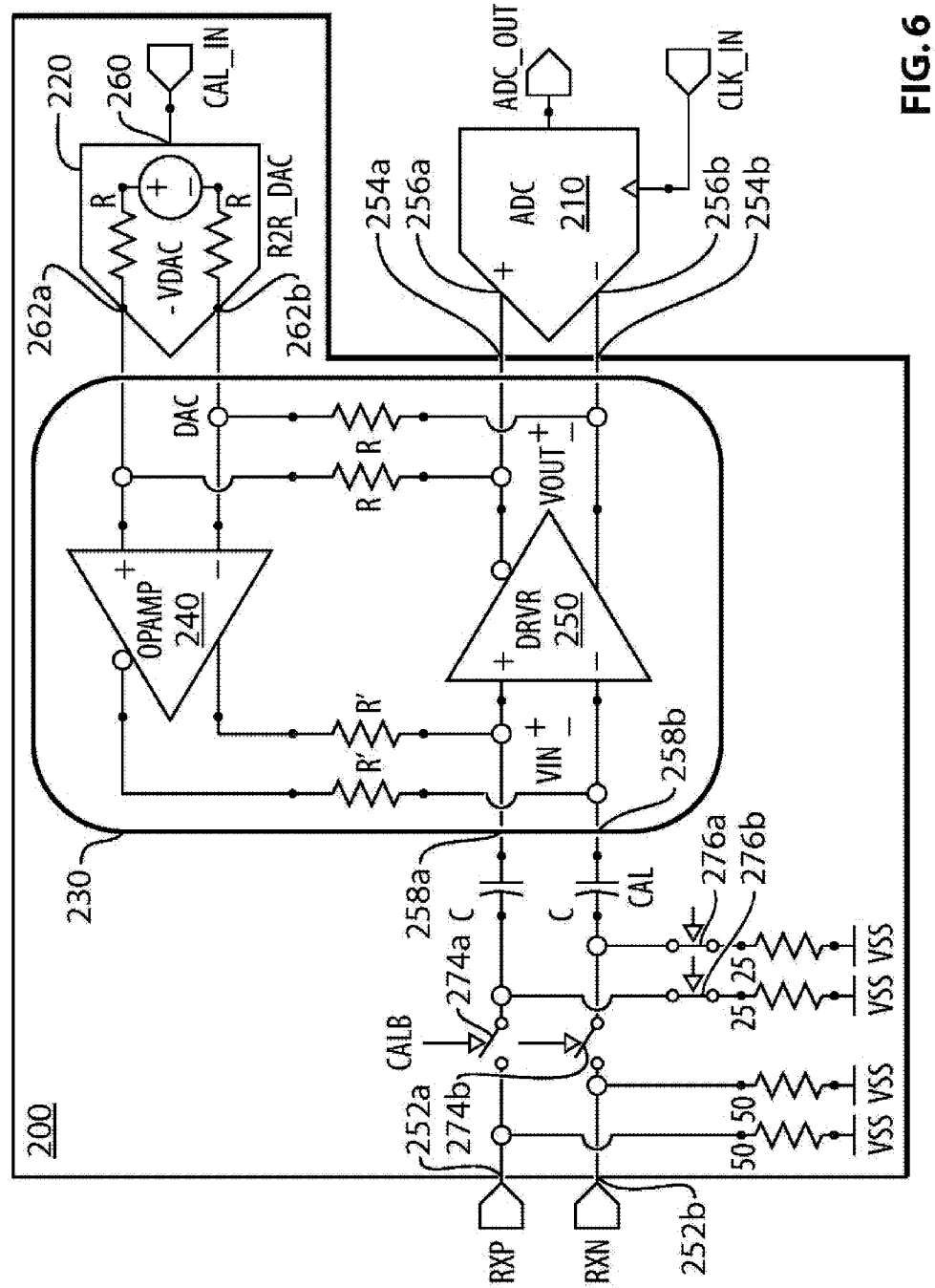
FIG. 6 is a circuit diagram of a calibration circuit for an ADC in a serial receiver in accordance with another embodiment of the present disclosure.

FIG. 6 shows a circuit diagram of a calibration circuit 200 connected to an ADC 210 in a serial communications receiver in accordance with another embodiment of the present disclosure is shown. All elements that are similar to those in FIG. 4 are identified by the same reference numeral and are not described in detail again to avoid obscuring the description.

In the embodiment shown in FIG. 6, the calibration circuit 200 also includes a first pair of switches 274a, 274b connected between the differential input 252a, 252b of the calibration circuit and an input port of the pair of capacitors, C. A second pair of switches 276a, 276b is connected between the first pair of switches 274a, 274b and ground VSS through a pair of 25-Ω resistors.

In the embodiment shown in FIG. 6, an input signal received at the positive and negative input pads RXP, RXN is squelched by the calibration circuit 200 when the ADC driver 250 is operating in the ADC calibration mode. When the ADC driver 250 is operating in the ADC calibration mode, both switches in the first pair of switches 274a, 274b are open and the first differential input 258a, 258b of the DC feedback circuit 230 is disconnected from the differential input 252a, 252b of the calibration circuit 200 and the pair of 50-Ω resistors. Also, when the ADC driver 250 is operating in the ADC calibration mode, the second pair of switches 276a, 276b are closed and the first differential input 258a, 258b of the DC feedback circuit 230 is connected to ground (real or virtual) through the pair of 25-Ω resistors. Because the circuit environment of the ADC driver 250 is identical when operating in both the ADC calibration mode and the ADC operation mode, the dynamic properties of the ADC driver 250 are unchanged. That is, the ADC driver 250 has the same low output impedance to absorb kick-back charge injection current from the ADC 210 and the same common-mode and power supply rejection as it does in ADC operation mode. Additionally, the DC control feedback control circuit 230 suppresses static errors, such as voltage offset and leakage current, caused by the ADC driver 250.

When the ADC driver 250 is operating in the ADC operation mode, both switches of the first pairs of switches 274a, 274b are closed and both switches of the second pair of switches 276a, 276b are open. Thus, the differential input 252a, 252b of the calibration circuit 200, and the pair of 50-Ω resistors are connected to the first differential input 258a, 258b of the DC feedback circuit 230, and the first differential input 258a, 258b of the DC feedback circuit 230 is disconnected from the pair of 25-Ω resistors.

Figure 7:
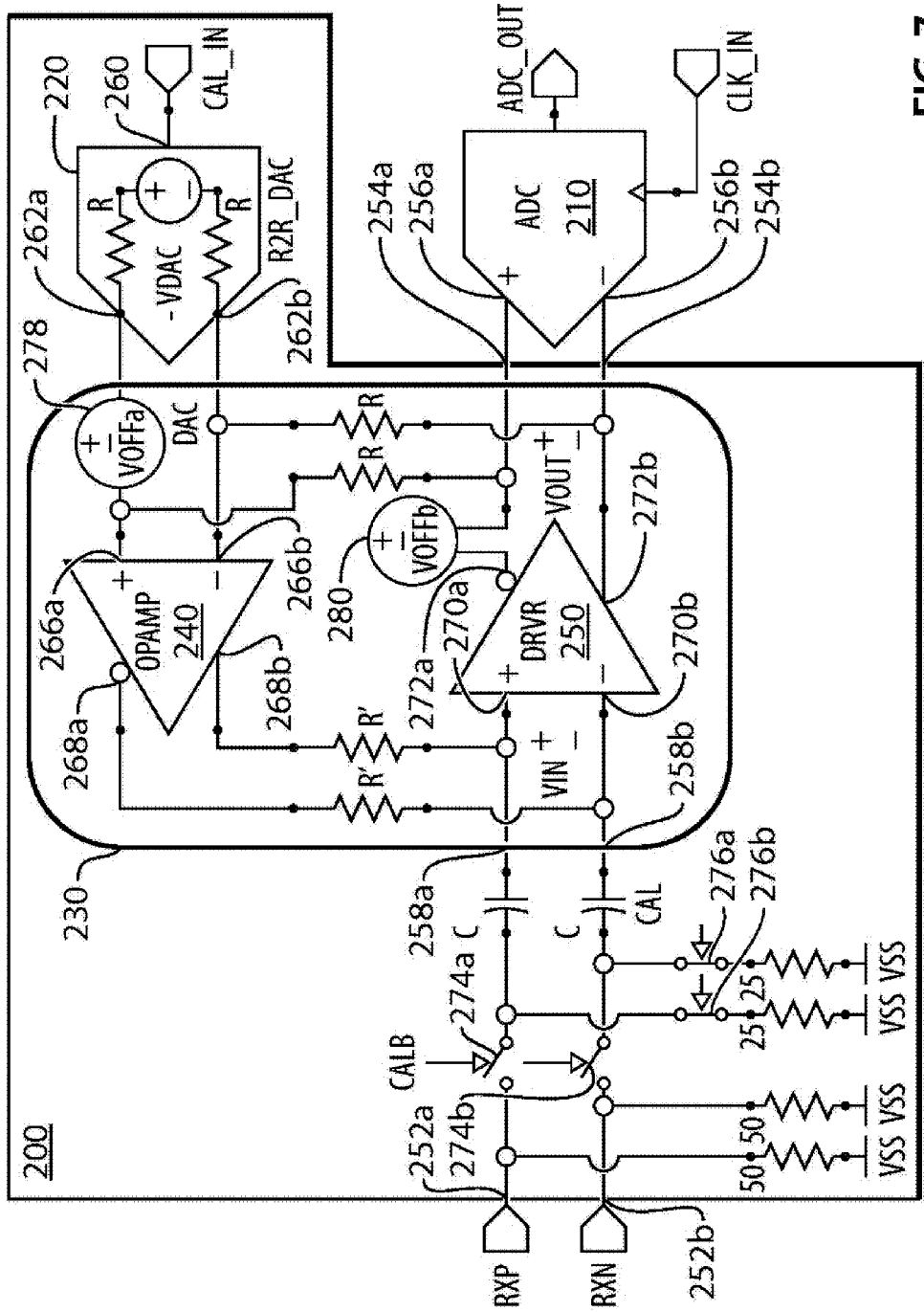
FIG. 7 is a circuit diagram of the calibration circuit of FIG. 6 with offset voltage sources added.

FIG. 7 shows a circuit diagram of the calibration circuit of FIG. 6 in which two voltage offset sources 278, 280 are added. The first voltage offset source 278 is added at one of the inputs, 266a of the op-amp 240. The second voltage source 280 is added at one of the outputs 272a of the ADC driver 250. The first voltage offset source 278 represents the input-referred offset voltage, Voffb, generated by the operational amplifier 240. The second voltage offset source 280 represents the output-referred offset voltage, Voffa, generated by the ADC driver 250. Using an equivalent circuit for the DC feedback circuit 230, the differential voltage VOUT provided at the differential output 254a, 254b of the calibration circuit 200 is as follows:

$$VOUT = VDAC(1-\varepsilon) + 2V_{offb}(1-\varepsilon) + V_{offa}\frac{\varepsilon}{1-\varepsilon} \quad (3)$$

where $\varepsilon$ denotes the relative error in the calibration voltage applied to the differential input 256a, 256b of the ADC 210, expressed in terms of return ratio r, loop gain T, of the DC feedback circuit 230:

$$\varepsilon = \frac{1}{1+T} = \frac{1}{1+A/2} \quad (4)$$

Equation (3) may be simplified to:

$$VOUT \approx VDAC(1-\varepsilon) + 2V_{offb} + \varepsilon V_{offa} \quad (5)$$

From equations (3) and (4), the DC feedback circuit 230 may be designed to have sufficient loop gain to bring the gain error and the contribution to the offset by the ADC driver 250 to negligibly low levels. The input-referred offset voltage, Voffb, generated by the operational amplifier 240, may be small as, contrary to the ADC driver 250, this amplifier can be designed with large (W×L) input devices. Furthermore, the same voltage offset is present when the ADC driver 250 is operating in the ADC calibration mode and when the ADC driver 250 is operating in the ADC operation mode, and hence the voltage offset will be calibrated out or suppressed. Only the offset drift 2Δ offb remains as an offset error.

Figure 8:
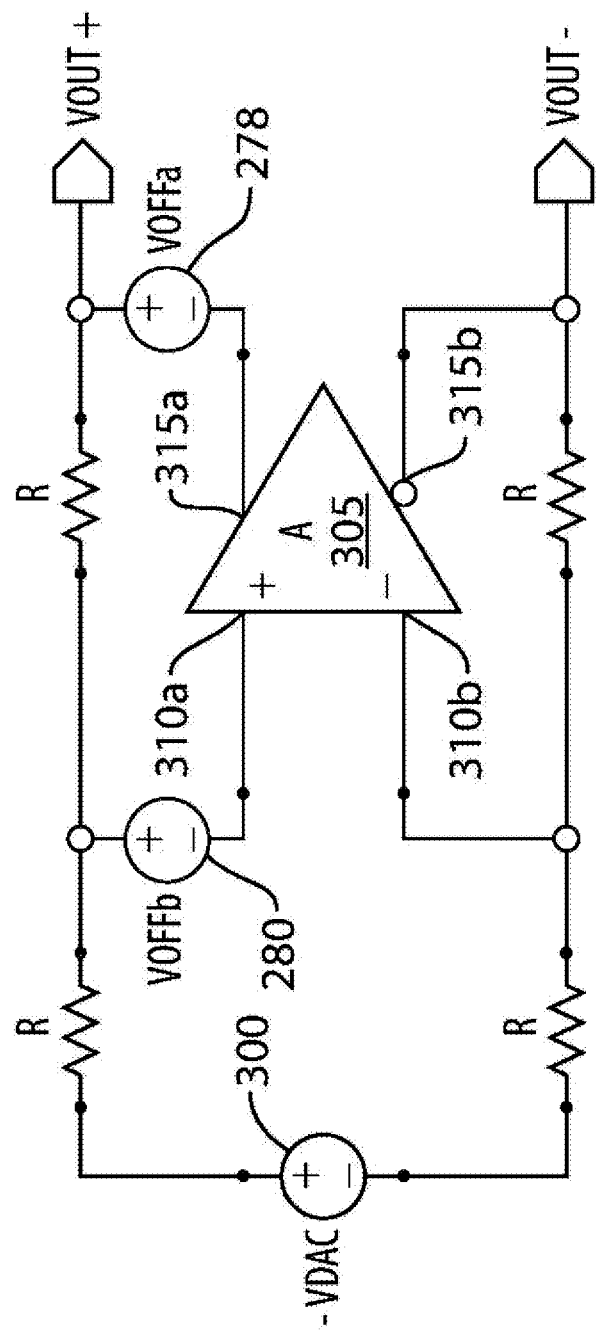
FIG. 8 is a circuit diagram of an alternative representation of the circuit of FIG. 7.

FIG. 8 shows an alternative representation of the calibration circuit 200 of FIG. 7. The alternative representation includes a voltage source 300 that represents the differential calibration voltage, VDAC, generated by the DAC 220, and a transimpedance differential amplifier 305 that is formed by DC feedback circuit 230. A positive terminal of the voltage source 300 is connected to a negative input 310a of the transimpedance differential amplifier 305 through a resistor R and the voltage offset source 280. A negative terminal of differential voltage source 300 is connected to a positive input 310b of the composite transimpedance differential amplifier 305 through a resistor R. The transimpedance differential amplifier 305 generates a modified differential calibration voltage, VOUT, and outputs the generated modified differential calibration voltage on its differential output 315a, 315b.

Figure 9:
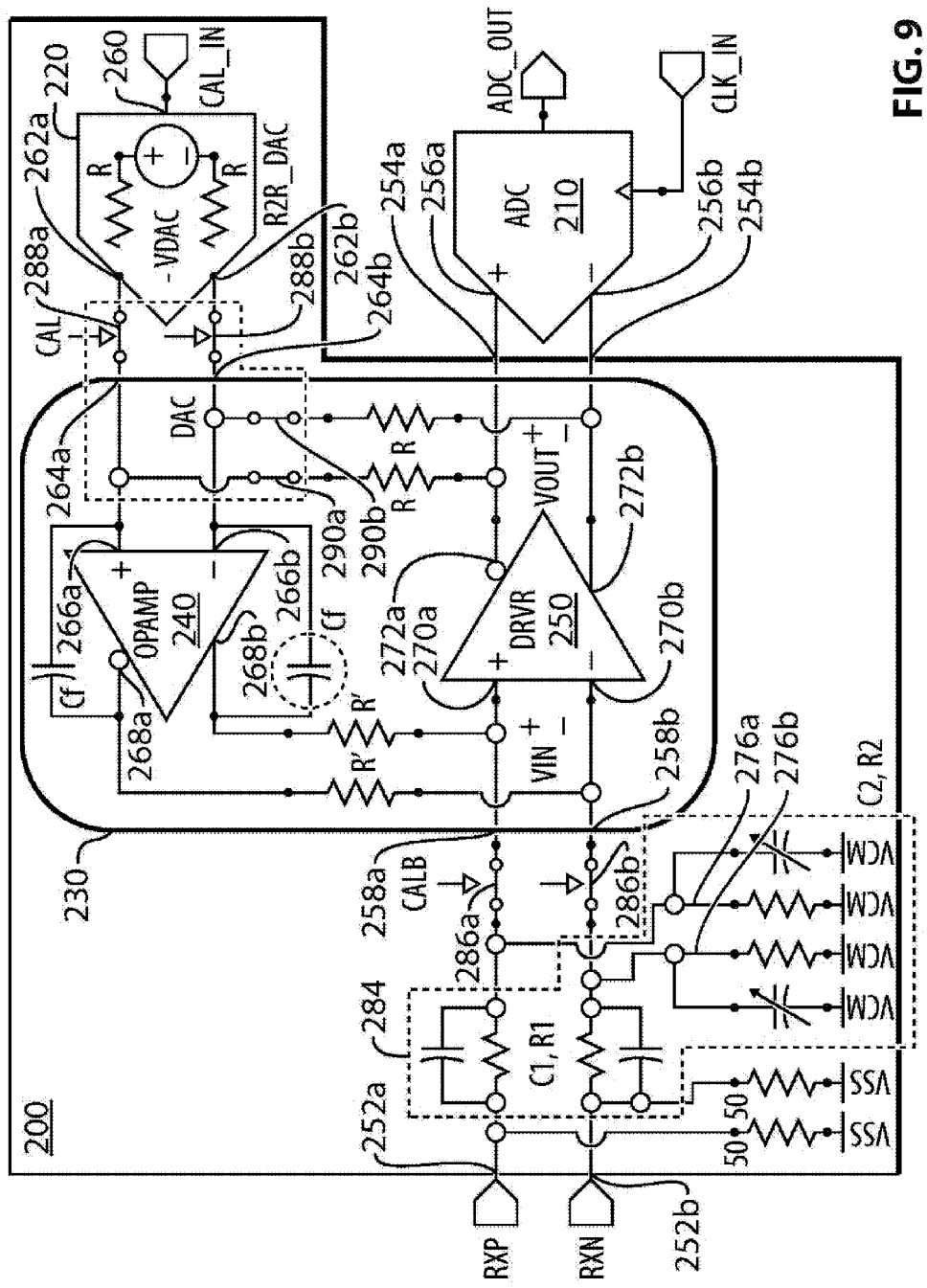
FIG. 9 is a circuit diagram of a calibration circuit for an ADC in accordance with another embodiment of the present disclosure.

FIG. 9 shows a circuit diagram of a calibration circuit 200 connected to an ADC 210 in a serial communications receiver in accordance with another embodiment of the present disclosure is shown. The calibration circuit 200 shown in FIG. 9 is implemented in a receiver of an optical transceiver chip.

The calibration circuit 200 includes a differential input 252a, 252b that is connected to positive and negative input pads RXP, RXN of the receiver of the optical transceiver chip, and a differential output 254a, 254b that provides a differential voltage, VOUT, to a differential input 256a, 256b of the ADC 210.

The differential input 252a, 252b of the calibration circuit 900 is connected to an RC equalizer 284 for DC coupling the positive and negative inputs RXP, RXN of the optical transceiver chip. The differential input 252a, 252b of the calibration circuit 200 is also connected to a first differential input 258a, 258b of the DC feedback loop 230 through a first pair of switches 286a, 286b.

The DAC 220 has an input 260 for receiving a digital code representing a calibration voltage, and a differential output 262a, 262b that is connected to a second differential input 264a, 264b of the DC feedback circuit 230 through a second pair of switches 288a, 288b. The differential output 264a, 264b of the DAC 220 provides a differential voltage, VDAC, to the DC feedback circuit 230. The DC feedback circuit 230 also has a differential output, which is the differential output 254a, 254b of the calibration circuit 200.

In the embodiment shown in FIG. 9, the operational amplifier 240 is an integrating operational amplifier to assure the required low-frequency cut-off for the data path.

The operational amplifier 240 has a differential input 266a, 266b that is connected to the second differential input 264a, 264b of the DC feedback circuit 230, and a differential output 268a, 268b. The ADC driver 250 has a differential input 270a, 270b that is connected to the first differential input 258a, 258b of the DC feedback circuit 230 and to the differential output 268a, 268b of the operational amplifier 240 through a pair of resistors R'. The ADC driver 250 also has a differential output 272a, 272b that is connected to the differential output 254a, 254b of the calibration circuit 200 and to the differential input 266a, 266b of the operational amplifier 240 through a pair of resistors R and a third pair of switches 290a, 290b. The differential input 266a, 266b and the differential output 268a, 268b of the op-amp 240 are also connected to each other through a pair of capacitors, Cf.

When the ADC driver 250 is in the ADC operation mode, the DAC 220 is disconnected from the DC feedback circuit 230 by opening the second pair of switches 288a, 288b. The DAC 220 is multiplexed to perform a separate task.

In the embodiment shown in FIG. 9, the accuracy of the −R/R composite inverting amplifier formed by the DC feedback circuit 230 is ensured by the third pair of closed switches 290a, 290b that are in series with the pair of feedback resistors R.

Disconnecting the DAC 220 from the DC feedback circuit 230 when the ADC driver 250 is operating in the ADC operation mode increases the loop gain (doubling) as the load by the DAC output resistance is removed, thus compensating for the loss due to the DC coupling of the receiver source.

Advantageously, the calibration circuit of the present disclosure facilitates ADC calibration with accuracy, even as device leakage and ADC resolution increase as new silicon fabrication processes are developed. Further, the calibration circuit of embodiments of the present disclosure provides one or more of the following features: suppresses errors due to leakage and charge kick-back at the input of the ADC; keeps ADC driver operational while maintaining dynamic properties of the driver, such as power supply rejection ratio, driving impedance, common mode rejection ratio; and suppresses DC offset due to the ADC driver. Moreover, the calibration circuit of the present disclosure may be used while squelching the receiver inputs.

The description is not to be considered as limited to the scope of the embodiments described herein. The described embodiments are to be considered in all respects only as illustrative and not restrictive. The scope of the claims should not be limited by the preferred embodiments set forth in the examples, but should be given the broadest interpretation consistent with the description as a whole. All changes that come with meaning and range of equivalency of the claims are to be embraced within their scope.

What is claimed is:

1. A calibration circuit for an analog-to-digital converter (ADC), the calibration circuit comprising:
   a digital-to-analog converter (DAC) configured to generate a calibration voltage from a digital input; and
   a DC feedback control circuit comprising an ADC driver and an operational amplifier, the ADC driver configured to operate in both an ADC calibration mode and in an ADC operation mode such that dynamic parameters of the ADC driver are unchanged when the ADC driver is operating in the ADC calibration mode and when the ADC driver is operating in the ADC operation mode;
   the DC feedback control circuit configured to:
      receive the calibration voltage from the DAC;
      modify the calibration voltage by suppressing offsets in the calibration voltage; and
      provide the modified calibration voltage to the ADC.

2. The calibration circuit of claim 1, wherein
   the DAC has an internal resistance;
   the DC feedback control circuit forms a transimpedance differential amplifier;
   the DAC internal resistance and the DC feedback control circuit together form an inverting unity gain differential amplifier;
   the DC feedback control circuit has a feedback loop impedance, the feedback loop impedance being equal to the internal resistance of the DAC to match the internal resistance of the DAC to the transimpedance of the differential transimpedance amplifier.

3. The calibration circuit of claim 1, wherein
   an input of the operational amplifier is coupled to an output of the DAC to receive the generated calibration voltage;
   an output of the operational amplifier is coupled to an input of the ADC driver; and
   an output of the ADC driver is coupled to the input of the operational amplifier and an output of the calibration circuit to provide the modified calibration voltage to the ADC.

4. The calibration circuit of claim 2, wherein the transimpedance differential amplifier formed by the DC feedback control circuit has non-unity gain.

5. The calibration circuit of claim 2, wherein the transimpedance differential amplifier formed by the DC feedback control circuit has unity gain.

6. The calibration circuit of claim 1, further comprising:
   a differential input for receiving an ADC input signal;
   a first pair of switches coupled to the differential input of the calibration circuit and to an input of the ADC driver, the first pair of switches configured to connect the differential input to the input of the ADC driver when the ADC driver is operating in the ADC calibration mode and to disconnect the differential input from the input of the ADC driver when the ADC driver is operating in the ADC operation mode.

7. The calibration circuit of claim 6, further comprising:
   a second pair of switches coupled to input of the ADC driver and to a ground via a pair of resistors, the second pair of switches being configured to connect the input of the ADC driver to the ground via the pair of resistors so that a source impedance and dynamic properties of the ADC driver are unchanged when operating in ADC calibration mode and when operating in ADC operation mode.

8. The calibration circuit of claim 6, further comprising an RC equalizer coupled to the differential input for DC coupling a differential voltage of a signal received on the differential input, and wherein the operational amplifier is an integrating operational amplifier.

9. The calibration circuit of claim 8, further comprising a third pair of switches coupled to the output of the DAC and to the input of the operational amplifier, the third pair of switches configured to connect the output of the DAC to the input of the operational amplifier when the ADC driver is operating in the ADC calibration mode and to disconnect the output of the DAC from the input of the operational amplifier when the ADC driver is operating in the ADC operation mode to increase a loop gain of the feedback control circuit.

10. The calibration circuit of claim 1, wherein the DC feedback control circuit is configured to suppress static errors generated by the ADC driver.

11. The calibration circuit of claim 10, wherein the static errors comprise a voltage offset generated by the ADC driver.

12. The calibration circuit of claim 10, wherein the static errors comprise a leakage current generated by the ADC driver.

13. A method for calibrating and operating an analog-to-digital converter (ADC), comprising:
   generating, at a digital-to-analog converter (DAC), a calibration voltage from a digital input;
   providing a DC feedback control circuit comprising an ADC driver and an operational amplifier;
   operating the ADC driver in an ADC calibration mode to modify the calibration voltage by suppressing offsets in the calibration voltage and to provide the modified calibration voltage to the ADC, the ADC driver having dynamic parameters in the ADC calibration mode, the dynamic parameters having a first set of values; and
   operating the ADC driver in an ADC operation mode, the ADC driver maintaining the first set of values of the dynamic parameters in the ADC operation mode.

* * * * *